United States Patent [19]

Kung

[11] Patent Number: 5,714,417
[45] Date of Patent: Feb. 3, 1998

[54] PLANARIZATION PROCESS USING ARTIFICIAL GRAVITY

[75] Inventor: Linliu Kung, Taipei, Taiwan

[73] Assignee: Vanguard International Semiconductor Corporation, Hsin-Chu, Taiwan

[21] Appl. No.: 703,919

[22] Filed: Aug. 22, 1996

[51] Int. Cl.$^6$ .................................................. H01L 21/4763
[52] U.S. Cl. ........................................... 438/626; 438/697
[58] Field of Search ................................... 437/231, 235; 438/626, 697

[56] References Cited

U.S. PATENT DOCUMENTS

| | | | |
|---|---|---|---|
| 4,973,544 | 11/1990 | Slayman et al. | 430/323 |
| 5,264,246 | 11/1993 | Ikeno | 427/240 |
| 5,348,615 | 9/1994 | Gupta | 156/635 |
| 5,449,644 | 9/1995 | Hong et al. | 437/225 |

FOREIGN PATENT DOCUMENTS 7-227568   8/1995   Japan.

*Primary Examiner*—Charles L. Bowers, Jr.
*Assistant Examiner*—Rencé R. Berry
*Attorney, Agent, or Firm*—George O. Saile; Stephen B. Ackerman

[57] ABSTRACT

The time needed to planarize the surface of an integrated circuit is reduced by causing the planarization liquid to settle in the presence of artificial gravity that supplements natural gravity. A number of different ways to achieve artificial gravity are described. These include centrifuging, magnetic repulsion, vertical pulling by a motor, and providing a pressure differential between the top and bottom sides of the wafer holder.

10 Claims, 4 Drawing Sheets

PLANARIZATION PROCESS USING ARTIFICIAL GRAVITY

BACKGROUND OF THE INVENTION

(1) Field of the Invention

The invention relates to the general field of semiconductor integrated circuits, more particularly to methods for planarizing the surface of a semiconductor wafer.

(2) Description of the Prior Art

As integrated circuits get formed, by depositing, and then shaping, a succession of layers, the outermost layer of the emerging structure becomes less and less planar. At some point this lack of planarity can no longer be tolerated and a planarization step is needed. A number of different methods for planarizing are in use in the industry, including chemical-mechanical polishing and liquid coating followed by freezing.

In the liquid coating method a liquid, such as a siloxane, which transforms into a glassy material on heating, is spread over the wafer surface by some standard method such as spin coating. Being a liquid, it finds its own level and settles after some period of time so that its upper surface is level, assuming that sufficient liquid was used to cover all protuberances on the surface of the wafer.

If excessively long settling times are to be avoided, liquids having relatively low viscosity have to be used. Unfortunately, in general, the lower the viscosity of the pretreated liquid the lower the density of the post-treatment glass. Since time is critical in a production environment, it is often the case that the liquid is not given sufficient time to fully settle so an excess is used and, following glass formation, this excess is then removed by chem-mech. polishing. This adds significantly to the cost of the planarizing step. Additionally, current methods for detecting just when sufficient glass has been removed by the chem-mech. polishing process are not entirely satisfactory and can lead to further loss of time or a reduction in final yield.

To avoid having to follow liquid planarization with chem-mech. polishing, it is necessary to add just the right amount of liquid to the wafer surface. This is not a problem, per se, but if insufficient time is allowed for the liquid to settle a number of defects can be introduced. For example, referring now to FIG. 1a, we show a schematic cross-section of a wafer substrate 1 on whose surface are a number of irregularites 3. Liquid layer 2 has been deposited over these with the intent of fully covering 3 and presenting a planar outer surface. Initially, before 2 has fully settled, its surface will be uneven, following approximately the countours of the underlying wafer, as shown.

In FIG. 1b a somewhat different scenario is represented. Although the surface of planarizing liquid layer 2 is more or less planar, settling is still not complete as a number of voids or bubbles 4 have been trapped in the liquid and more time will be needed for them to rise to the surface and disappear.

FIG. 1c is similar to 1a in that, initially, the surface of the planarizing liquid 2 roughly contours the surface of substrate 1, including protuburances 13. Since 13 are spaced relatively far apart, observations in regions of the wafer surface such as 5 could lead to the mistaken conclusion that the liquid had fully settled whereas liquid areas such as 7 (directly over 13) have not. FIG. 1d illustrates an extreme case of the scenario of FIG. 1c wherein liquid regions 8 not only still sit atop protuburances 13 but are on the verge of collapsing upon themselves to form voids such as 4 in FIG. 1b.

Thus, in order to deal with the problems outlined above, some means for reducing the time needed by the planarizing liquid to fully settle are sought. In the present invention the problem has been solved by the provision of artificial gravity as an assist to the earth's gravity during settling. We found somewhat different solutions to the problem in the prior art.

For example, Gupta (U.S. Pat. No. 5,348,615 Sep. 1994) proposes the use of regelation as a means for temporarily reducing viscosity, thereby reducing settling time during planarization. The method works only for settling in very small areas and, more seriously, the class of materials that are subject to the regelation phenomenon is very small.

Ikeno (U.S. Pat. No. 5,264,246 Nov. 1993) teaches a modified spin coating method wherein rotation of the wafer is combined with tilting it so that some centrifugal force is also applied to the wafer. An inherent difficulty associated with this approach is that it is subject to a shadowing problem—planarizing liquid moving parallel to the wafer surface is shadowed by the various irregularities on the surface and builds up on the sides that face the center. As a result, an excess amount of the liquid must be used to ensure that everything gets covered and the subsequent chem-mech. polishing step is still needed.

SUMMARY OF THE INVENTION

It has been an object of the present invention to provide a method for reducing the time needed for a planarizing liquid to settle.

A further object of the invention has been that, once said method has been exercised, additional planarization steps are not needed.

Yet another object of the invention has been to describe apparatus that may be used for the exercise of said method.

These objects have been achieved by causing the planarization liquid to settle in the presence of artificial gravity that supplements natural gravity. A number of different ways to achieve artificial gravity are described. These include centrifuging, magnetic repulsion, vertical pulling by a motor, and providing a pressure differential between the top and bottom sides of the wafer holder.

DESCRIPTION OF THE PREFERRED EMBODIMENTS

The present invention teaches that planarization through first depositing a liquid on the wafer surface and then converting it to a solid can be substantially improved if the liquid settling time is reduced by using artificial gravity. Such a reduction in settling time is important because it allows liquids of greater viscosity to be used and/or it reduces the incidence of defects in the planarized surface resulting from premature freezing. Thus, after the application of the planarizing liquid, an artificial gravitational force is applied in a direction normal to the wafer surface and, once the liquid has settled, the liquid is converted to a solid.

For our planarizing liquid we have used (low viscosity) spin-on-glass (SOG) or (high viscosity) borophosphosilicate glass (BPSG) but any liquid with similar characteristics could have been used. These liquids have a viscosity (at room temperature) between about 0.01 and $10^{10}$ poise. The quantity of planarizing liquid that is used is such that, once settled, the thickness of the liquid is between about 0.1 and 1 microns. To convert the planarizing liquid to a solid we typically heat (in nitrogen) for between about 30 and 60 minutes at a temperature between about 800° and 900° C. We now discuss several different embodiments of the invention for providing the artificial gravitational force:

1st EMBODIMENT

Figure 1A:
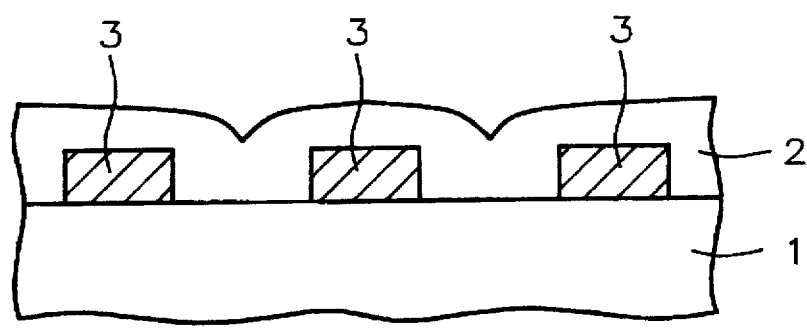
FIGS. 1a–1d illustrate some of the problems that can arise when a planarizing liquid is not given sufficient time to settle.
Figure 1B:
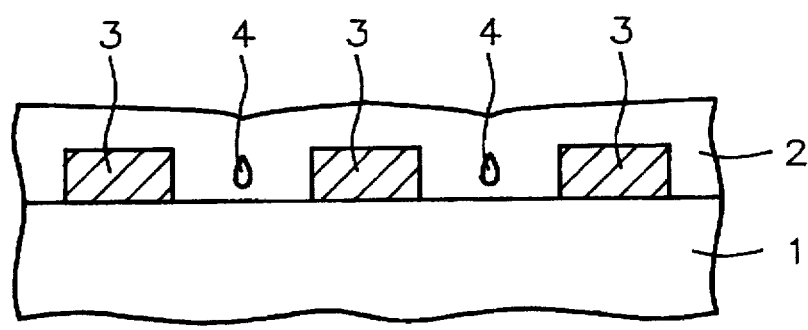
Figure 1C:
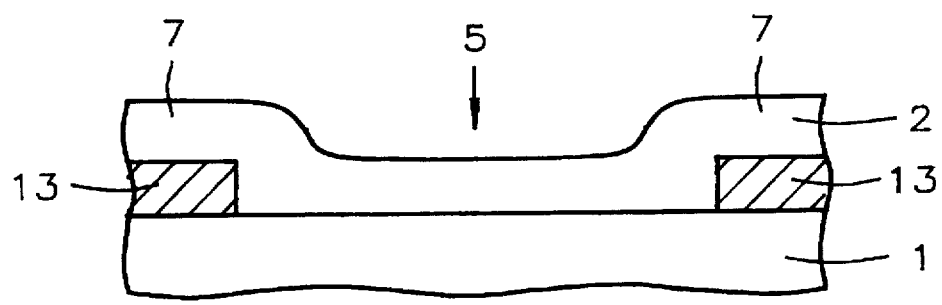
Figure 1D:
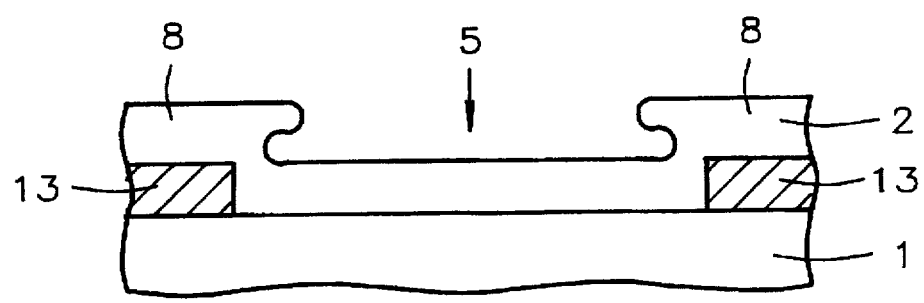
Figure 2:
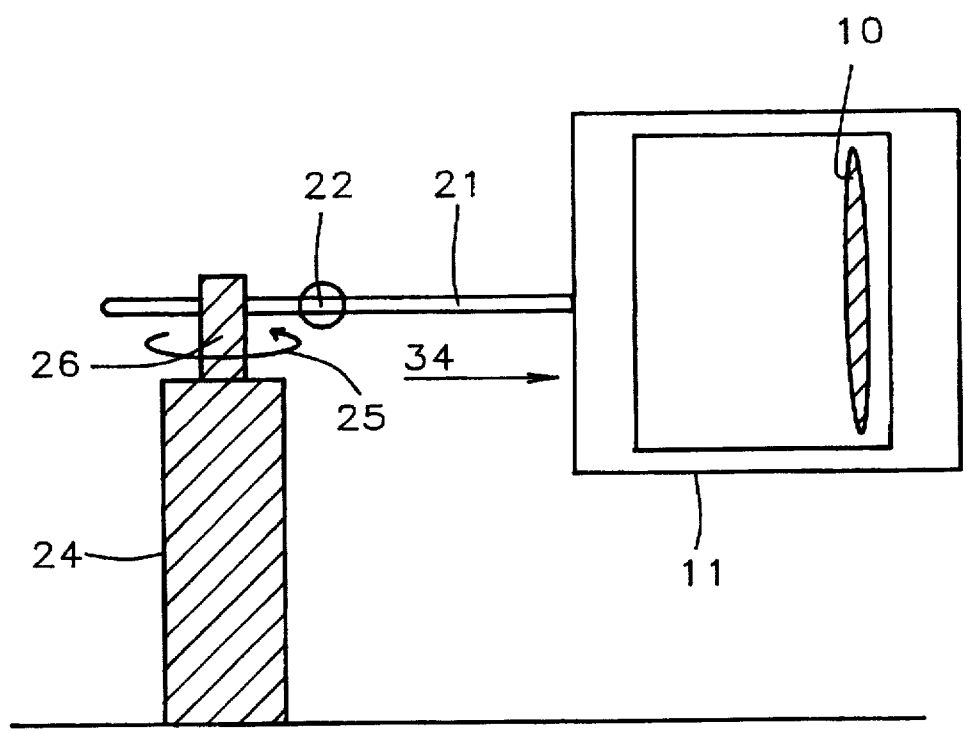
FIG. 2 illustrates an embodiment of the invention wherein a centrifuge is used to generate artificial gravity.

Referring to FIG. 2, wafer 10, precoated with planarizing liquid, is placed at the bottom of holding, or isolation, chamber 11. Initially, centrifuge arm 21 hangs vertically downward from pivot point 22. As centrifuge shaft 26 begins to rotate, through the action of centrifuge motor 24, arm 21, and attached chamber 11, begin to move outwards until 21 is fully horizontal as seen in the figure. In general, the centrifuge's angular velocity 25 will be in the range of from about 500 to about 8,000 revolutions per minute. For an effective centrifuge arm length of about 15 cm. this corresponds to a gravitational force between about 56 and 14,000 times the earth's gravity at the wafer surface.

By using such artificial gravitational force (applied for a period of time between about 0.2 and 4 minutes) it becomes possible to reduce the minimum settling time for our planarizing liquid by a useful amount.

2nd EMBODIMENT

Figure 3:
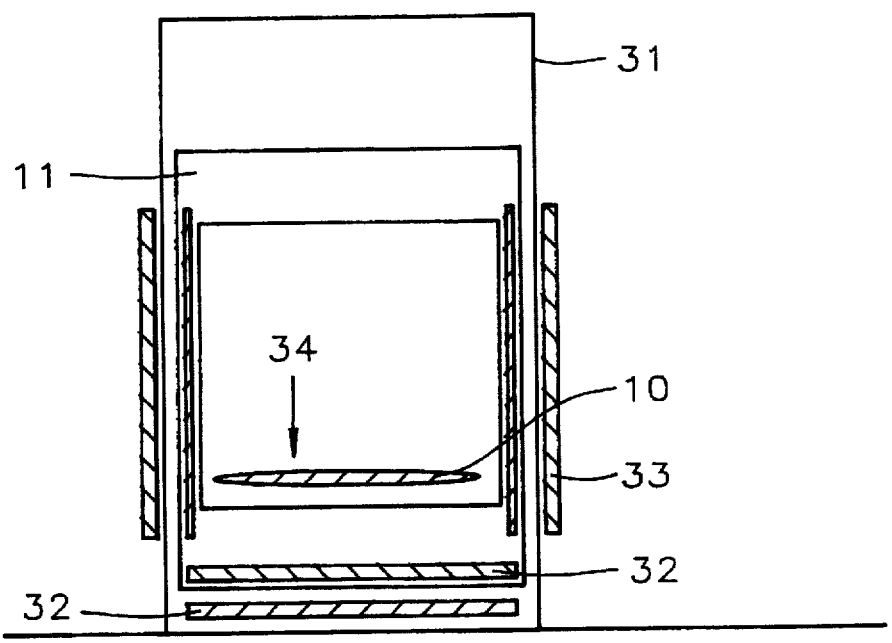
FIG. 3 illustrates an embodiment of the invention wherein mutually repellent magnetic coils are used to generate artificial gravity.

Referring now to FIG. 3, wafer 10, precoated with planarizing liquid, sits near the bottom of isolation chamber 11 which in turn sits inside sleeve 31. Chamber 11 is free to move up and down inside 31. A pair of magnetic coils 32 (or, alternatively, permanent magnets) are arranged so that one coil lies on the bottom of isolation chamber 11 and is rigidly attached thereto. The other coil lies on the bottom of sleeve 31. Initially, chamber 11 is at rest in its lowest position inside sleeve 31. The coils are then activated by passing current through them so that they are polarized in opposite directions. Thus, like magnetic poles are suddenly facing each other so they immediately and rapidly move apart. Since only 11 is free to move it acquires the full rapid upward motion in a very short time. That is, it is rapidly accelerated in a direction normal to the wafer surface, providing an artificial gravitational force between several tens and several thousand times earth gravity for a few tenths of a second. The motion introduced by the sudden activation of coils 32 is self-limiting since the repulsive force diminishes very rapidly as they pull apart and the weight of 11 soon causes the direction of motion to be reversed.

Coils 33 are arranged to be concentric, with the inner coil rigidly attached to chamber 11 while the outer coil is rigidly attached to sleeve 31. Initially, chamber 11 is at its lowest position in sleeve 31 and the two coils are lined up. The coils are then activated by passing current through them so that they are similarly polarized at their ends. This causes the rapid ejection of the inner coil which moves in its only available direction, namely upward. Once the inner coil has moved a short distance upward, relative to the outer coil, the repulsive force driving it becomes insignificant but now the attractive force between the bottom of the inner coil and the top of the outer coil becomes significant and the relative motion continues, stopping once the two coils are in equilibrium.

The present invention could work with either coils 32 or 33 operating alone or, as shown in the figure, operating together. For any of these possible configurations the activating current is turned off after less than a few tens of seconds, chamber 11 is allowed to slide to its lowest position in sleeve 31, and then the entire process is repeated—as often as desired.

3rd EMBODIMENT

Figure 4:
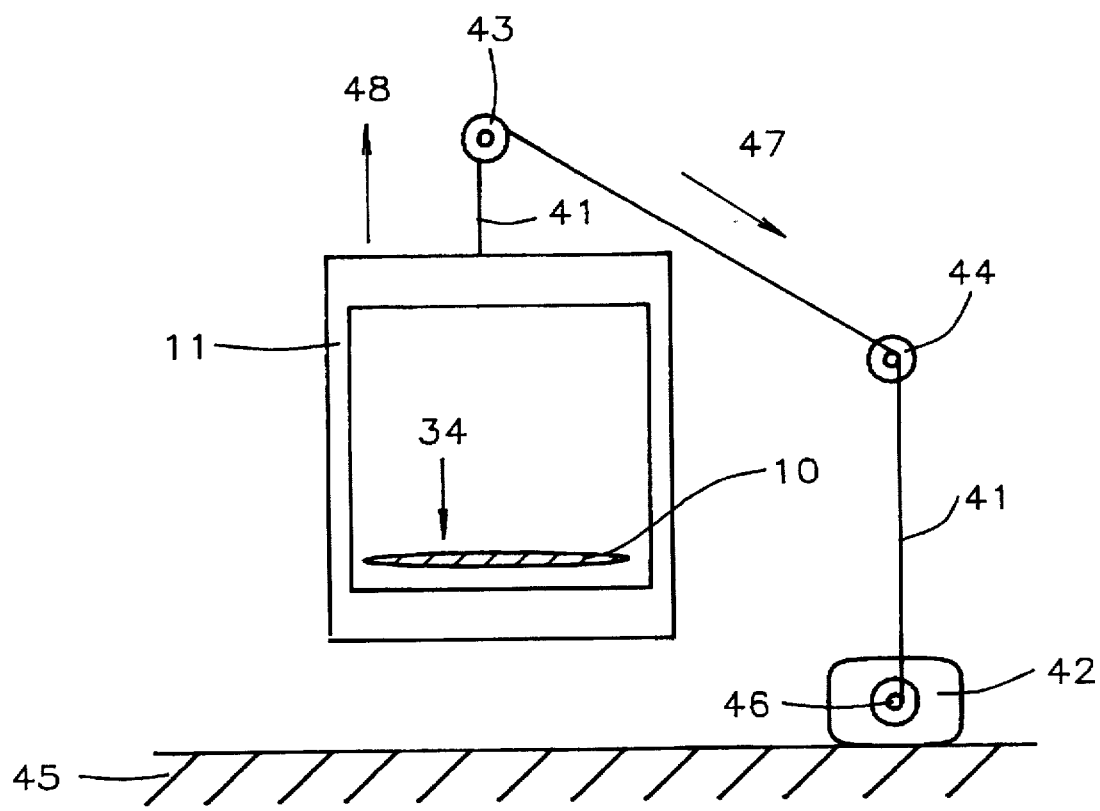
FIG. 4 illustrates an embodiment of the invention wherein rapid upward motion caused by an electric motor is used to generate artificial gravity.

Referring now to FIG. 4, wafer 10, precoated with planarizing liquid, sits near the bottom of isolation chamber 11. A connection has been made to the top of 11 by a flexible connector 41 which runs over direction changing pulleys 43 and 44, to electric motor 42. Initially, chamber 11 is at rest on surface 45 and connector 41 is not connected to motor 42. Then, using a suitable clutch mechanism (not shown), 41 is attached to 42 at shaft 46 and is immediately pulled in directions 47 and 48, the latter being vertical upward motion for chamber 11. Thus, wafer 10 will be subjected to rapid vertical motion, implying rapid acceleration in that direction. The attachment of 41 to 46 is allowed to be in effect for less than about several tens of seconds, following which 41 is released, chamber 11 slides down to rest once more on surface 45, and then the entire process may be repeated as often as desired.

Since the attachment of 41 to motor 42 is for such a very short time, it is desireable to maximise the distance travelled by chamber 11 during that time. To that end, in a further refinement of this embodiment, a suitable set of gears and/or pulleys is located between motor 42 and the point where 41 attaches to chamber 11 so that the motion of 41 is magnified relative to that of shaft 46. That is, the mechanical advantage of these gears and/or pulleys is less than one.

4th EMBODIMENT

Figure 5:
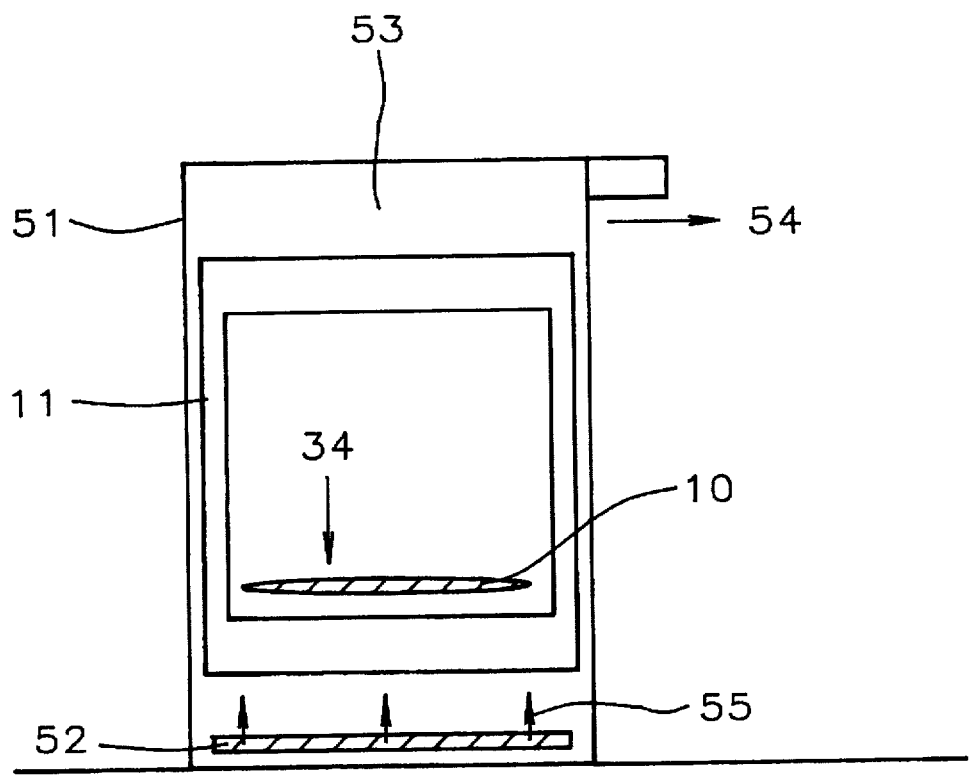
FIG. 5 illustrates an embodiment of the invention wherein a pressure differential between the top and under sides of the wafer holder is used to generate artificial gravity.

Referring now to FIG. 5, wafer 10, precoated with planarizing liquid, sits near the bottom of isolation chamber 11. In a somewhat similar arrangement to that shown in FIG. 3, chamber 11 is inside sleeve 51. In this embodiment, however, the ends of the sleeve are closed off and, while 11 is able to move freely up and down inside 51, its fit inside 51 is such that gas cannot leak past it between the upper half 53 and the lower half 52 of closed off sleeve 51.

Initially, chamber 11 rests near the bottom of 51 and the upper and lower chambers (53 and 52 resp.) are at the same gas pressure (about 760 torr). Then, simultaneously, lower chamber 52 is connected to the atmosphere through vents 55 and upper chamber 53 is connected to a source of vacuum through exhaust vent 54. This causes chamber 11 to move rapidly in an upward direction, thereby accelerating wafer 10 in a direction normal to its surface.

To prevent damage to chamber 11 and particularly to wafer 10, a shock absorbing mechanism (not shown) is provided at the top of chamber 11 and/or the bottom of sleeve 51's upper surface. The state of vacuum for upper chamber 53 and atmospheric pressure for lower chamber 52 is maintained for a time period in the range of less than several tens of seconds and several hundred seconds, following which air is slowly admitted into 53 and 52 is gently evacuated so that chamber 11 slides down to the bottom of sleeve 51 and the entire process can then be repeated as many more times as desired.

While the invention has been particularly shown and described with reference to the preferred embodiments thereof, it will be understood by those skilled in the art that various changes in form and details may be made without departing from the spirit and scope of the invention.

What is claimed is:

1. A method for planarizing a surface of an integrated circuit wafer comprising:

applying a quantity of a liquid, having a settling rate and a viscosity between about $10^{-2}$ and $10^{10}$ poise, to said surface increasing the settling rate by applying an artificial gravitational force to said liquid in a direction normal to said surface; and once the liquid has settled and has a planar upper surface, converting the liquid to a solid.

2. The method of claim 1 wherein said liquid is spin-on-glass or BPSG.

3. The method of claim 1 wherein the step of converting said liquid to a solid further comprises heating for between about 30 and 60 minutes at a temperature between about 800° and 900° C.

4. The method of claim 1 wherein said quantity of liquid is such that, when settled, it forms a layer between about 0.1 and 1 microns thick.

5. The method of claim 1 wherein said artificial gravitational force is centrifugal force.

6. The method of claim 5 wherein the centrifugal force is achieved by revolving the wafer at an angular velocity between about 500 and 8,000 revolutions per minute thereby generating an artificial gravitational force between about 56 and 14,000 times normal gravity.

7. The method of claim 1 wherein applying an artificial gravitational force further comprises moving the wafer in a direction normal to its surface, thereby generating an artificial gravitational force between about 56 and 14,000 times normal gravity.

8. The method of claim 7 wherein said movement, normal to the wafer surface, further comprises:

mounting a first magnetic coil in fixed spatial relationship relative to the wafer;

mounting a second magnetic coil in a fixed position; and energizing both coils in a manner that causes them to repel one another.

9. The method of claim 7 wherein said movement, normal to the wafer surface, further comprises:

placing the wafer in an isolation chamber; and simultaneously increasing gas pressure below the isolation chamber and decreasing gas pressure above the isolation chamber, thereby causing said isolation chamber, including the wafer, to move in an upward direction.

10. The method of claim 7 wherein said movement, normal to the wafer surface, further comprises vertically pulling on a connector to said wafer.

* * * * *